US006747396B2

(12) United States Patent
Blom

(10) Patent No.: US 6,747,396 B2
(45) Date of Patent: Jun. 8, 2004

(54) PIEZOELECTRIC ACTUATOR FOR INK JET PRINTHEAD

(75) Inventor: Francisus Richard Blom, Mierlo (NL)

(73) Assignee: Oce-Technologies B.V., Venlo (NL)

( * ) Notice: Subject to any disclaimer, the term of this patent is extended or adjusted under 35 U.S.C. 154(b) by 0 days.

(21) Appl. No.: 09/785,312

(22) Filed: Feb. 20, 2001

(65) Prior Publication Data

US 2001/0010443 A1 Aug. 2, 2001

Related U.S. Application Data

(63) Continuation of application No. 09/235,549, filed on Jan. 22, 1999.

(30) Foreign Application Priority Data

Jan. 23, 1998 (EP) ........................................... 98200189

(51) Int. Cl.[7] ................................................ H01L 41/08

(52) U.S. Cl. ....................... 310/328; 310/331; 310/359; 310/366

(58) Field of Search ................................ 317/358, 359, 317/366, 328

(56) References Cited

U.S. PATENT DOCUMENTS

| | | | |
|---|---|---|---|
| 5,153,477 | A | 10/1992 | Jomura et al. |
| 5,278,471 | A | 1/1994 | Uehara et al. |
| 5,345,137 | A | 9/1994 | Funakubo et al. |
| 5,552,658 | A | 9/1996 | Dibbern et al. |
| 5,786,833 | A | 7/1998 | Naka et al. |
| 5,814,919 | A | 9/1998 | Okumura |

FOREIGN PATENT DOCUMENTS

| | | | |
|---|---|---|---|
| EP | 05 18380 | A2 | 12/1992 |
| EP | 07 23866 | A1 | 7/1996 |
| EP | 07 57939 | A1 | 2/1997 |
| GB | 2 28320 6 | A | 5/1995 |
| JP | 6 266971 | | 8/1994 |

OTHER PUBLICATIONS

Japanese Abstract: 09156100, date Jun. 17, 1997.

Japanese Abstract: 07223315, date Aug. 22, 1995.

Japanese Abstract: 05198860, date Aug. 6, 1993.

*Primary Examiner*—Mark Budd

(74) *Attorney, Agent, or Firm*—Birch, Stewart, Kolasch & Birch, LLP

(57) ABSTRACT

A piezoelectric actuator for an ink jet printhead, including:

a block body of piezoelectric material having a bottom face through which the mechanical energy of the actuator is transferred to a receiving member, said body having an active portion adjacent to the bottom face as well as an inactive portion;

a layered structure of alternating signal electrodes and common electrodes arranged in the active portion substantially in parallel with the bottom face and separated by layers of the piezoelectric material;

a layered structure of alternating auxiliary electrodes and common electrodes arranged in the inactive portion, substantially in parallel with the bottom face and separated by layers of the piezoelectric material;

at least one signal lead electrode formed on a first side face of said block body of piezoelectric material and interconnecting the signal electrodes;

a ground lead electrode formed on a second side face opposite to the first side face and interconnecting the common electrodes;

and an auxiliary lead electrode interconnecting the auxiliary electrodes, wherein the auxiliary lead electrode is formed on a third side face of the block body.

9 Claims, 2 Drawing Sheets

PIEZOELECTRIC ACTUATOR FOR INK JET PRINTHEAD

This application is a continuation of co-pending application Ser. No. 09/235,549, filed on Jan. 22, 1999, the entire contents of which are hereby incorporated by reference and for which priority is claimed under 35 U.S.C. § 120; and this application claims priority of Application No. 98200189.3 filed in Europe on Jan. 23, 1998 under 35 U.S.C. § 119.

BACKGROUND OF THE INVENTION

The present invention relates to a piezoelectric actuator for an ink jet printhead, comprising: a body of piezoelectric material having a bottom face through which the mechanical energy of the actuator is transferred to a receiving member, said body having an active part adjacent to the bottom face as well as an inactive part; a layered structure of alternating signal electrodes and common electrodes arranged in the active part in parallel with the bottom face and separated by layers of the piezoelectric material; a layered structure of alternating auxiliary electrodes and common electrodes arranged in the inactive part in parallel with the bottom face and separated by layers of the piezoelectric material; at least one signal lead electrode formed on a first side face of said body and interconnecting the signal electrodes; a ground lead electrode formed on a second side face opposite to said first side face and interconnecting the common electrodes; and an auxiliary lead electrode interconnecting the auxiliary electrodes.

An actuator of the type described hereinabove is used for pressurizing liquid ink in an ink jet printhead, so that ink droplets can be jetted-out from nozzles of the printhead. Typically, the printhead has a linear array of nozzles, and each nozzle is connected to an ink channel that is filled with ink. The ink channels are arranged in parallel with each other and are covered by a sheet-like receiving member which is bonded to the bottom face of the actuator so that it can be deformed in accordance with the expansion and retraction strokes of the actuator for compressing the ink in the ink channels. The active part of the piezoelectric body is divided into a plurality of parallel fingers associated with the respective individual ink channels and separated by dicing cuts cut into the bottom face of the body. The inactive part of the body forms a bridge-like structure which interconnects the fingers on the side opposite to the bottom face.

The signal lead electrodes are respectively associated with the individual fingers, so that an ink droplet from a selected one of the nozzles can be obtained by applying a voltage across the associated signal lead electrode and the ground lead electrode.

The inactive bridge portion of the piezoelectric body serves as a backing member which bears the reaction forces of the active actuator fingers and also facilitates the manufacturing process in that it permits the production of a plurality of fingers as a one-piece construction, by simply forming dicing cuts in the piezoelectric body. The auxiliary electrodes in the inactive part are not needed when the printhead is operating. These auxiliary electrodes are only needed in the process of manufacturing the actuator.

As is well known in the art, a piezoelectric device made for example of piezoelectric ceramic needs to be polarized during the manufacturing process in order to show the desired piezoelectric effect. This polarizing step is accompanied by an anisotropic shrinkage or expansion of the piezoelectric material. Thus, when only the active part were polarized, the piezoelectric body as a whole would behave like a bimorph element and would undesirably be distorted or even broken. This is why the auxiliary electrodes are also used for polarizing the inactive part of the piezoelectric body.

FIG. 4 illustrates an example of a printhead 10 in which a commercially available piezoelectric actuator 12 is employed.

The printhead 10 comprises a support member 14 on which a channel plate 16 is disposed. A plurality of parallel ink channels 18 are formed in the top surface of the channel plate 16. Only one of these ink channels 18 is shown in FIG. 4. One end of the ink channel 18 is formed as a nozzle 20 from which ink droplets are to be expelled. The rear end of the ink channel is connected to an ink supply system (not shown) which is accommodated in the support member 14. A receiving member 22 is formed as a thin flexible sheet and is superposed on the channel plate 16 so that it covers all the ink channels 18 and the nozzles 20.

The actuator 12 comprises a body 24 made of a piezoelectric ceramic and shaped as a parallelepiped having a bottom face 26 which is bonded to the receiving member 22. The portion of the body 24 adjacent to the bottom face 26 is subdivided into a plurality of fingers 28 which are arranged in parallel with one another and with the ink channels 18. Each finger 28 is disposed directly above a respective one of the ink channels 18. However, it can be seen in FIG. 4 that the body 24 and also the fingers 28 thereof extend beyond the ink channels 18 on the side opposite to the nozzles 20. Only the part of the fingers 28 situated above the ink channels 18 is formed as an active part 30 of the piezoelectric actuator. This active part 30 comprises a layered structure with alternating signal electrodes 32 and common electrodes 34. The common electrodes 34 extend only over the active part 30, whereas the signal electrodes 32 extend over the entire length of the body 24 and, accordingly, are also present in an inactive part 36 which is offset from the ink channels 18.

The portion of the body 24 bridging the individual fingers 28 and situated above the active part 30 forms another inactive part 38. This inactive part 38 contains a layered structure with alternating common electrodes 34 and auxiliary electrodes 40.

All the electrodes 32, 34 and 40 are formed by plane rectangular sheets of conductive material arranged in parallel with the bottom face 26 of the body 24 and separated from each other by layers of ceramic material.

The signal electrodes 32 of each finger 28 are interconnected with each other by a signal lead electrode 42 formed on a rear side face of the body 24, i.e. the side face opposite to the nozzles 20. Similarly, all the common electrodes 34 in the active part 30 and the inactive part 38 are interconnected by a common ground lead electrode 44 formed on the front side face of the body 24. The auxiliary electrodes 40 are interconnected by a common auxiliary lead electrode 46 formed again on the rear side face of the body 24 but separated from the signal lead electrodes 42 by a gap 48.

The signal lead electrodes 42 and the ground lead electrode 44 are connected to respective contact electrodes 50 and 52' formed on the bottom face 26 of the body 24. The contact electrode 52 extends beyond the rear ends of the ink channels 18. All the contact electrodes 50 and 52 are electrically connected to a control circuit (not shown) via electrical leads formed on a connecting piece 54. The connecting piece 54 is formed by a flexible foil which is sandwiched between the bottom face 26 of the body 24 and the receiving member 22 below the inactive part 36.

When an energizing signal is supplied to one of the signal lead electrodes 42 via the associated contact electrode 50 and the connecting piece 54, the active part 30 of the corresponding finger 28 performs an expansion stroke, so that the receiving member 22 is flexed downward and compresses the ink contained in the ink channel 18, thereby expelling an ink droplet from the nozzle 20.

In order to avoid losses in the mechanical energy transferred to the receiving member 22, it is preferable that the connecting piece 54 is not provided between the active part 30 of the actuator and the receiving member 22 but is only provided in the rear of the ink channels 18. The body 24 has been extended rearwardly beyond the ink channels 18 in order to provide a sufficient contact area between the contact electrodes 50 and 52 and the connecting piece 54. Since the receiving member 22 cannot flex downwardly in this area because it is supported by the channel plate 16, the part 36 of the body 24 is inactive and does not contain common electrodes 34.

It will be noted that in the conventional actuator 12 shown in FIG. 4 the connecting piece 54 must adjoin with the bottom face 26 because the front and rear side faces of the inactive top part of the body 24 are occupied by the ground lead electrode 44 and the auxiliary lead electrode 46 which are needed for connecting the common electrodes 34 and auxiliary electrodes 40 in the inactive part 38 during the polarizing step.

SUMMARY OF THE INVENTION

It is an object of the present invention to provide a piezoelectric actuator which offers more freedom of design when the actuator is employed in an ink jet printhead.

According to the present invention, the auxiliary lead electrode is formed on a third side face of the block. This has the advantage that the first and second side faces of the block can be used in their entirety for connecting the signal electrodes and the common electrodes, which permits more freedom of choice with respect to the position where a connecting piece is adjoined to the piezoelectric block. In particular, the connecting piece may be adjoined to the block in a position remote from the bottom face, for example, on the top face opposite to the bottom face.

In a piezoelectric printhead the actuator must be firmly bonded to the receiving member because the actuator must be capable of not only performing compression strokes but also expansion strokes for drawing the ink into the ink channel. In view of the extremely small width dimensions of the ink channels and the associated piezoelectric fingers, this bonding step is a rather intricate procedure. Bonding is normally performed by means of an adhesive which needs to be cured at high temperatures. Thus, when a thin foil serving as the connecting piece is sandwiched between the actuator and the receiving member, this connecting piece may be deteriorated by the heat applied in the bonding step. This problem can easily be avoided by the design according to the present invention, because it permits the connecting piece to be adjoined at the top face of the piezoelectric body after the actuator has been bonded to the receiving member and the adhesive has been cured. This offers the remarkable additional advantage that the electronic components which would be destroyed by high temperatures can be integrated on the connecting piece.

In addition, when the connecting piece is no longer sandwiched between the actuator and the receiving member, there is no need to extend the piezoelectric body of the actuator beyond the ink channels. Thus, the actuator may be shortened so that it is provided only above the ink channels and no longer needs to have an inactive part adjacent to the bottom face. As a result, the actuator becomes more compact and less expensive.

BRIEF DESCRIPTION OF THE DRAWINGS

The preferred embodiments of the present invention will now be described in conjunction with the accompanying drawings in which.

DETAILED DESCRIPTION OF THE INVENTION

Figure 1:
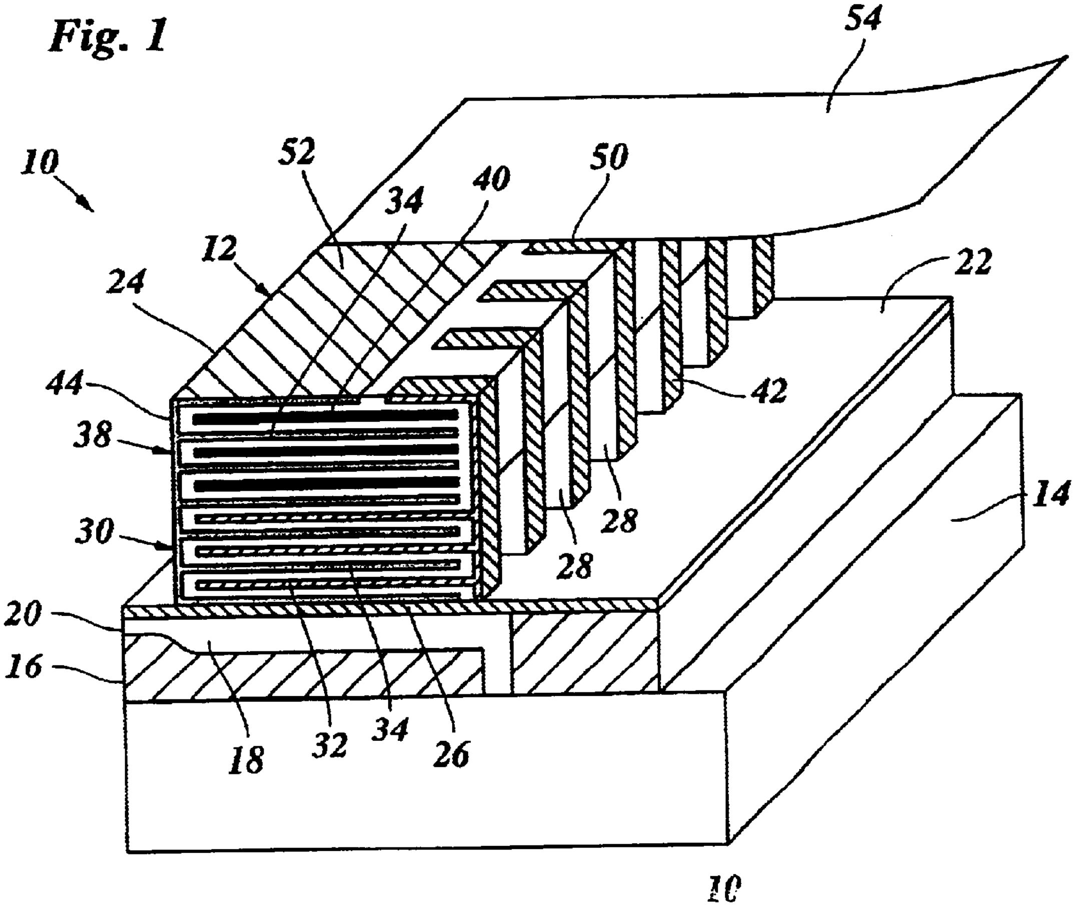
FIG. 1 is a perspective view of an ink jet printhead employing a piezoelectric actuator according to the present invention, with portions broken away for illustration purposes.
Figure 4:
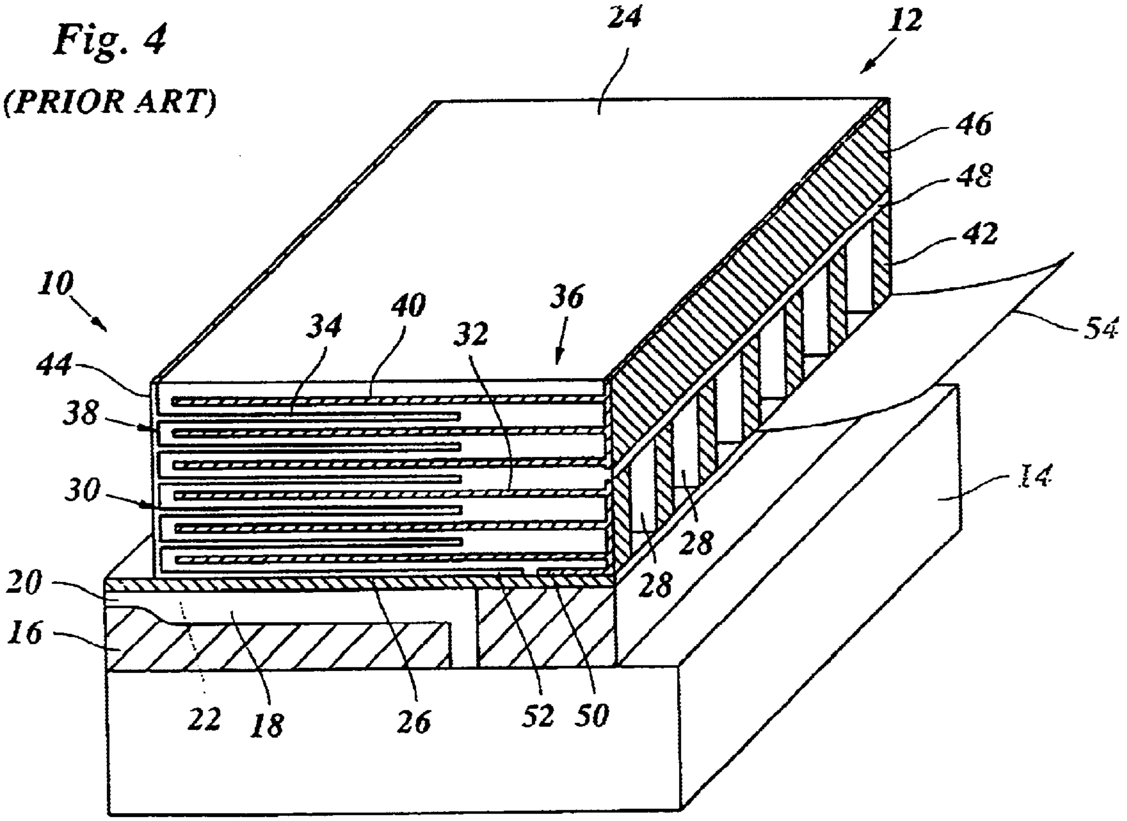
Fig. 4 (PRIOR ART)
FIG. 4 shows a printhead with a conventional actuator.

The ink jet printhead 10 shown in FIG. 1 has the same general construction as the printhead that has already been described in conjunction with FIG. 4. Like parts are designated by like reference numerals, and as for details of the components that have already been described, reference is made to the introductory part of this specification.

The main difference between the printheads shown in FIGS. 4 and 1 is that, in FIG. 1, the piezoelectric actuator 12 according to the present invention has been employed and that the connecting piece 54 is adjoined to the top face of the body 24 of the actuator. Accordingly, the contact electrodes 50 and 52 are formed on the top face of the body 24 and are electrically connected to the signal electrodes 32 and common electrodes 34, respectively, by signal lead electrodes 42 and a ground lead electrode 44 which extend over the total height of the rear and front side faces of the block 24.

Figure 2:
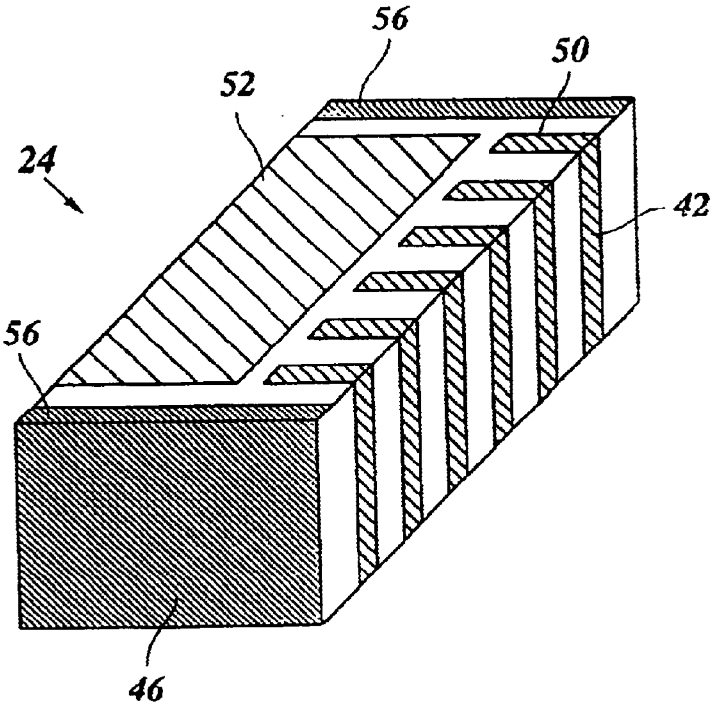
FIG. 2 is a perspective view of a piezoelectric block which is to be processed further to form the actuator according to FIG. 1.

The auxiliary electrodes 40 must of course be electrically isolated from the signal and ground lead electrodes 42, 44 and can therefore be led out neither to the rear side face nor to the front side face of the block 24. Instead, these auxiliary electrodes 40 are led out to one or both lateral side faces of the block 24 and are electrically interconnected by auxiliary lead electrodes 46 formed on these lateral side faces, as is shown in FIG. 2.

Auxiliary contact electrodes 56 are formed on both lateral ends of the top face of the body 24 and are electrically connected to the respective auxiliary lead electrodes 46. Thus, when the printhead is operating and the auxiliary electrodes 40 are not used, they may be short-circuited with the common electrodes 34 by means of leads which are formed on the connecting piece 54 and interconnect the contact electrodes 52 and 56. It will be observed that, in FIG. 2, the fingers 28 of the actuator are not yet separated from one another. In order to complete the actuator, it is necessary to separate these fingers by forming dicing cuts in the bottom face of the block 24. The signal lead electrodes 42 and the contact electrodes 50 for each finger are formed in a stripe configuration so that they are electrically isolated from those of the neighboring fingers also in the top part of the body 24.

It will further be observed in FIG. 1 that the length of the body 24 in longitudinal direction of the ink channels 18 is smaller than in FIG. 4 and that the actuator is provided only above the ink channels 18. This is possible because the connecting piece 54 is adjoined to the top face of the actuator and need not be sandwiched between the bottom face of the actuator and the receiving member 22. Thus, the inactive part 36 of the body 24 adjacent to the bottom face 26 can be omitted in FIG. 1 and the actuator according to this embodiment of the invention is only divided into a lower active part 30 adjacent to the bottom face 26 and an inactive part 38 superimposed thereon.

Figure 3:
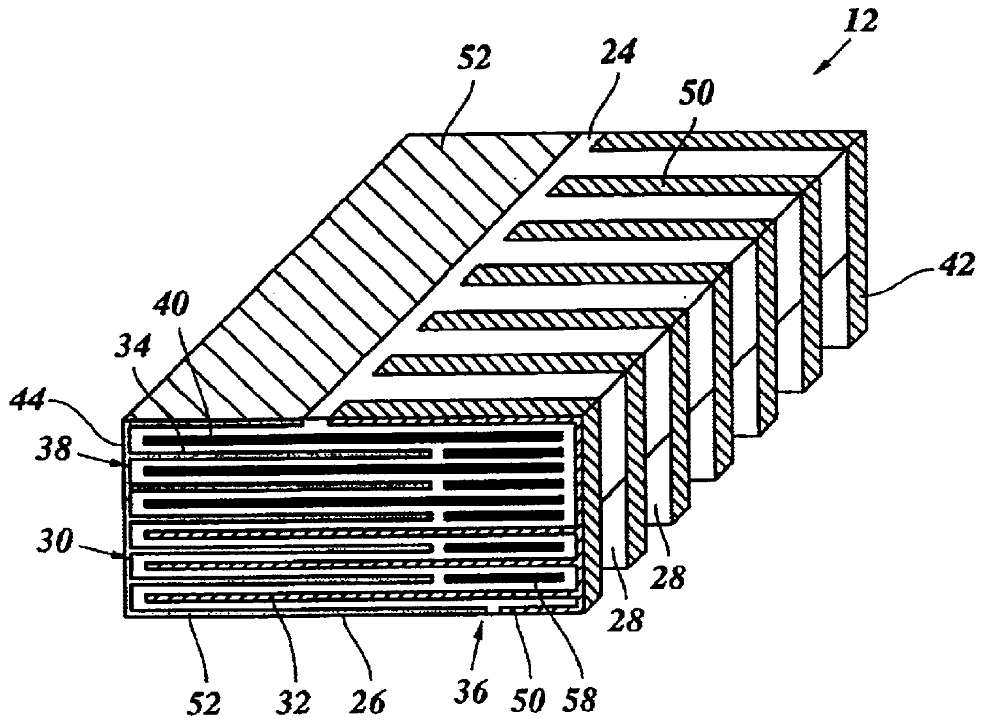
FIG. 3 shows a piezoelectric actuator according to another embodiment of the present invention.

FIG. 3 shows a modified embodiment of the actuator 12 which has contact electrodes 50, 52 formed on both the top face and the bottom face, so that a connecting piece may be applied either to the top face or the bottom face, as desired. Similarly as the conventional actuator shown in FIG. 4, this actuator has an inactive part 36 extending vertically over the entire height of the block 24.

The auxiliary electrodes 40 in the upper portion of the block 24 are provided continuously in both inactive parts 38 and 36. The inactive part 36 includes additional dummy electrodes 58 which are flush with the common electrodes 34. Within the fingers 28 the dummy electrodes 58 are alternating with the signal electrodes 32, whereas, in the upper portion of the inactive part 36, these dummy electrodes are alternating with the auxiliary electrodes 40.

Similarly as in FIG. 2, the auxiliary electrodes 40 and the dummy electrodes 58 are connected to auxiliary lead electrodes provided on the lateral side faces of the block 24. When the block 24 according to FIG. 3 is polarized during the manufacturing process, the auxiliary electrodes 40 and the dummy electrodes 58 are short-circuited with the signal electrodes 32 whereas the common electrodes 34 are grounded. Thus, a voltage drop will occur only across the alternating electrodes in the active part 30 and the inactive part 38, so that the piezoelectric material will be polarized in these parts. In the inactive part 36 which extends vertically over the total height of the block 24, all the auxiliary electrodes 40 and dummy electrodes 58 are at a high potential during the polarizing step, so that no voltage drop occurs and the piezoelectric material is not polarized, just as in the conventional design.

The provision of the dummy electrodes 58 facilitates the manufacturing process in that they permit obtaining a block 24 of even thickness simply by laminating electrode layers and layers of piezoelectric material one upon the other.

It should be noted that the thickness of the electrodes is exaggerated in the drawings for illustration purposes and, on the other hand, the number of electrode layers may be considerably larger than shown in the drawings.

While only specific embodiments of the present invention have been described above, it will occur to a person skilled in the art that various modifications can be made within the scope of the appended claims.

What is claimed is:

1. A piezoelectric actuator for an ink jet printhead, comprising:

a block body of piezoelectric material having a bottom face through which the mechanical energy of the actuator is transferred to a receiving member, said body having an active portion adjacent to the bottom face as well as an inactive portion disposed between said active portion and a top face of said block body, wherein the active portion is divided into a plurality of fingers arranged in parallel to one another and integrally connected with each other by the inactive portion of the block body, a layered structure of alternating signal electrodes and common electrodes arranged in the active portion, substantially parallel with the bottom face and separated by layers of the piezoelectric material;

a layered structure of alternating auxiliary electrodes and common electrodes arranged in the inactive portion, substantially parallel with the bottom face and separated by layers of the piezoelectric material;

at least one signal lead electrode formed on a first side face of said block body of piezoelectric material and interconnecting the signal electrodes, wherein a separate signal lead electrode is formed on each finger of the active portion and is extended over the inactive portion of the block body;

a ground lead electrode formed on a second side face opposite to the first side face and interconnecting the common electrodes;

and an auxiliary lead electrode interconnecting the auxiliary electrodes, wherein the auxiliary lead electrode is formed on a third side face of the block body.

2. A piezoelectric actuator according to claim 1, wherein contact electrodes connected to each of the signal lead electrodes and a contact electrode electrically connected to the ground lead electrode are formed on a top face of the block body opposite to said bottom face.

3. A piezoelectric actuator according to claim 2, wherein at least one additional contact electrode is formed on an edge portion of the top face of the block body and is electrically connected to the auxiliary lead electrode.

4. The piezoelectric actuator according to claim 3, wherein the contact electrodes are formed on both the top face and the bottom face of the block body.

5. A piezoelectric actuator for an ink jet printhead, comprising:

a block body of piezoelectric material having a bottom face through which the mechanical energy of the actuator is transferred to a receiving member, said body having an active portion adjacent to the bottom face as well as a first inactive portion disposed between said active portion and a top face of said block body, wherein the active portion is divided into a plurality of fingers arranged in parallel to one another and integrally connected with each other by the inactive portion of the block body;

a layered structure of alternating signal electrodes and common electrodes arranged in the active portion, substantially parallel with the bottom face and separated by layers of the piezoelectric material;

a layered structure of alternating auxiliary electrodes and common electrodes arranged in the first inactive portion, substantially parallel with the bottom face and separated by layers of the piezoelectric material;

at least one signal lead electrode formed on a first side face of said block body of piezoelectric material and interconnecting the signal electrodes, wherein a separate signal lead electrode is formed on each finger of the active portion and is extended over the inactive portion of the block body;

a ground lead electrode formed on a second side face opposite to the first side face and interconnecting the common electrodes;

and an auxiliary lead electrode interconnecting the auxiliary electrodes, wherein the auxiliary lead electrode is formed on a third side face of the block body, and wherein the block body comprises a second inactive part adjacent to a portion of the bottom face.

6. The piezoelectric actuator according to claim 5, wherein the auxiliary electrodes extend over both inactive portions of the block body, and dummy electrodes are provided in the second active portion, each dummy electrode being arranged in the same plane as a corresponding one of the common electrodes and being electrically connected to the auxiliary lead electrode.

7. An ink jet printhead containing a piezoelectric actuator, said piezoelectric actuator comprising:

a block body of piezoelectric material having a bottom face through which the mechanical energy of the actuator is transferred to a receiving member, said body haying an active portion adjacent to the bottom face as well as an inactive portion disposed between said active portion and a top face of said block body, wherein the active portion is divided into a plurality of fingers arranged in parallel to one another and integrally connected with each other by the inactive portion of the block body;

a layered structure of alternating signal electrodes and common electrodes arranged in the active portion, substantially parallel with the bottom face and separated by layers of the piezoelectric material;

a layered structure of alternating auxiliary electrodes and common electrodes arranged in the inactive portion, substantially parallel with the bottom face and separated by layers of the piezoelectric material;

at least one signal lead electrode formed on a first side face of said block body of piezoelectric material and interconnecting the signal electrodes, wherein a separate signal lead electrode is formed on each finger of the active portion and is extended over the inactive portion of the block body;

a ground lead electrode formed on a second side face opposite to the first side face and interconnecting the common electrodes;

and an auxiliary lead electrode interconnecting the auxiliary electrodes, wherein the auxiliary lead electrode is formed on a third side face of the block body, and wherein at least one ink channel terminates in a nozzle and is covered by a flexible receiving member, said piezoelectric actuator being bonded to said flexible receiving member.

8. The ink jet printhead according to claim 7, wherein a connecting piece electrically connects the signal electrodes and common electrodes of the actuator and is disposed on a top face of the block body opposite to the bottom face thereof.

9. The ink jet printhead according to claim 8, wherein the length of the actuator in the longitudinal direction of the ink channels is equal to or smaller than the length of the ink channels.

* * * * *